United States Patent
Müller et al.

(10) Patent No.: US 7,901,766 B2
(45) Date of Patent: *Mar. 8, 2011

(54) ELECTRONIC DEVICES COMPRISING AN ORGANIC CONDUCTOR AND SEMICONDUCTOR AS WELL AS AN INTERMEDIATE BUFFER LAYER MADE OF A CROSSLINKED POLYMER

(75) Inventors: David Christoph Müller, München (DE); Nina Riegel, Köln (DE); Frank Meyer, Heidelberg (DE); René Scheurich, Groβ-Zimmern (DE); Aurélie Falcou, Frankfurt am Main (DE); Klaus Meerholz, Rösrath (DE)

(73) Assignee: Merck Patent GmbH, Darmstadt (DE)

( * ) Notice: Subject to any disclaimer, the term of this patent is extended or adjusted under 35 U.S.C. 154(b) by 1039 days.

This patent is subject to a terminal disclaimer.

(21) Appl. No.: 10/570,372

(22) PCT Filed: Sep. 4, 2004

(86) PCT No.: PCT/EP2004/009903
§ 371 (c)(1),
(2), (4) Date: Mar. 21, 2006

(87) PCT Pub. No.: WO2005/024971
PCT Pub. Date: Mar. 17, 2005

(65) Prior Publication Data
US 2006/0251886 A1 Nov. 9, 2006

(30) Foreign Application Priority Data
Sep. 4, 2003 (DE) .................................. 103 40 711

(51) Int. Cl.
B32B 27/06 (2006.01)
B32B 27/26 (2006.01)
B32B 33/00 (2006.01)
(52) U.S. Cl. ....................... 428/336; 428/411.1; 428/413
(58) Field of Classification Search ........................ None
See application file for complete search history.

(56) References Cited

U.S. PATENT DOCUMENTS

| | | | |
|---|---|---|---|
| 4,720,432 A | 1/1988 | VanSlyke et al. | |
| 5,518,824 A | 5/1996 | Funhoff et al. | |
| 5,596,208 A | 1/1997 | Dodabalapur et al. | |
| 5,705,826 A | 1/1998 | Aratani et al. | |
| 5,792,557 A | 8/1998 | Nakaya et al. | |
| 5,840,217 A | 11/1998 | Lupo et al. | |
| 6,107,452 A * | 8/2000 | Miller et al. | 528/422 |
| 6,169,163 B1 * | 1/2001 | Woo et al. | 528/397 |
| 6,335,480 B1 | 1/2002 | Bach et al. | |
| 6,458,909 B1 | 10/2002 | Spreitzer et al. | |
| 6,956,095 B2 | 10/2005 | Treacher et al. | |
| 6,994,893 B2 | 2/2006 | Spreitzer et al. | |
| 2002/0197511 A1 * | 12/2002 | D'Andrade et al. | 428/690 |
| 2003/0180574 A1 | 9/2003 | Huang et al. | |
| 2004/0017148 A1 | 1/2004 | Redecker | |
| 2004/0054152 A1 | 3/2004 | Meerholz et al. | |
| 2004/0097101 A1 * | 5/2004 | Kwong et al. | 438/781 |
| 2005/0038223 A1 | 2/2005 | Becker et al. | |
| 2007/0034862 A1 | 2/2007 | Parham et al. | |

FOREIGN PATENT DOCUMENTS

| | | |
|---|---|---|
| EP | 0 637 899 | 2/1995 |
| EP | 0 676 461 | 10/1995 |
| EP | 0 880 303 | 11/1998 |
| EP | 1 308 781 | 5/2003 |
| JP | 07-085973 A | 3/1995 |
| JP | 9-255774 A | 9/1997 |
| JP | 2000-077185 | 3/2000 |
| JP | 2001-076874 A | 3/2001 |
| WO | WO-94/05045 | 3/1994 |
| WO | WO-95/31833 | 11/1995 |
| WO | WO-98/03566 | 1/1998 |
| WO | WO-98/27136 | 6/1998 |
| WO | WO-98/48433 | 10/1998 |
| WO | WO-99/10939 | 3/1999 |
| WO | WO-00/42668 | 7/2000 |
| WO | WO-02/10129 | 2/2002 |
| WO | WO-02/21611 A1 | 3/2002 |
| WO | WO-02/072714 | 9/2002 |
| WO | WO-03/020790 | 3/2003 |
| WO | WO-03/048225 | 6/2003 |
| WO | WO-2004/037887 | 5/2004 |

OTHER PUBLICATIONS

Müller et al., Synthetic Metals, vol. 111-112, pp. 31-34, 2000.*
Chang, et al.,, "Multicolor Organic Light-Emitting Diodes Processed by Hybrid Inkjet Printing", Advanced Materials, vol. 11, No. 9, 1999, pp. 734-737.
Bernius, M., et al., "Fluorene-based polymers-preparation and applications", Journal of Materials Science: Materials in Electronics, vol. 11, 2000, pp. 111-116.
Braig, T., et al., "Crosslinkable hole-transporting polymers by palladium-catalyzed C-N-coupling reaction", Macromol. Rapid Commun., vol. 21, No. 9, 2000, pp. 583-589.

(Continued)

Primary Examiner — Ramsey Zacharia
(74) Attorney, Agent, or Firm — Connolly Bove Lodge & Hutz LLP

(57) ABSTRACT

The invention relates to electronic devices whose electronic properties can surprisingly be improved to a significant degree by inserting at least one crosslinkable polymeric buffer layer, preferably a cationically crosslinkable polymeric buffer layer, between the conductive doped polymer and the organic semiconductor layer. Particularly good properties are obtained with a buffer layer in which crosslinking is thermally induced, i.e. by raising the temperature to 50 to 250° C. Alternatively, crosslinking can be radiation-induced by adding a photoacid. Moreover, such a buffer layer can be advantageously applied by means of printing techniques, especially inkjet printing, as the ideal temperature for the thermal treatment is independent of the glass transition temperature of the material. This avoids having to rely on material that has a low molecular weight, making it possible to apply the layer by means of printing techniques. The next layer (the organic semiconductor layer) can also be applied with the aid of different printing techniques, particularly inkjet printing, because the buffer layer is rendered insoluble by the crosslinking process, thus preventing the buffer layer from solubilizing thereafter.

19 Claims, No Drawings

OTHER PUBLICATIONS

Carter, S. A., et al., "Polymeric anodes for improved polymer light-emitting diode performance", Appl. Phys. Lett. vol. 70, No. 16, 1997, pp. 2067-2069.

Muller, D. C., et al., "Efficient Blue Organic Light-Emitting Diodes with Graded Hole-Transport Layers", Chemphyschem, No. 4, 2000, pp. 207-211.

Elias, H. G., "Makromolekule", Bard 1. Grundlager: Struktur—Synthese—Eigerschafter, Huthig & Wepf Verlag, Basel, 5. Aufidge, 1990, pp. 392-405.

Goethals, E., et al., Cationic Ring-Opening Polymerization, Laboratory of Organic Chemistry, 1992, pp. 67-109.

Crivello, et al., "Complex Triarylsulfonium Salt Photoinitiators. II. The Preparation of Several New Complex Triarylsulfonium Salts and the Influence of Their Structure in Photoinitiated Cationic Polymerization", Journal of Polymer Science: Polymer Chemistry Edition (1980), vol. 18, pp. 2697-2714.

* cited by examiner

ELECTRONIC DEVICES COMPRISING AN ORGANIC CONDUCTOR AND SEMICONDUCTOR AS WELL AS AN INTERMEDIATE BUFFER LAYER MADE OF A CROSSLINKED POLYMER

RELATED APPLICATION

This application is a national stage application (under 35 U.S.C. 371) of PCT/EP2004/009903 filed Sep. 4, 2004 which claims benefit to German application 103 40 711.1 filed Sep. 4, 2003.

Electronic devices which comprise organic, organometallic and/or polymeric semiconductors are being used ever more frequently in commercial products or are just about to be introduced onto the market. Examples which may be mentioned here are organic-based charge-transport materials (generally hole transporters based on triarylamine) in photocopiers and organic or polymeric light-emitting diodes (OLEDs or PLEDs) in display devices. Organic solar cells (O-SCs), organic field-effect transistors (O-FETs), organic thin-film transistors (O-TFTs), organic integrated circuits (O-ICs), organic optical amplifiers or organic laser diodes (O-lasers) are well advanced at a research stage and could achieve major importance in the future.

Many of these devices, irrespective of the application, have the following general layer structure, which is matched correspondingly for the individual applications:

(1) Substrate
(2) Electrode, frequently metallic or inorganic, but also of organic or polymeric conducting materials
(3) Charge-injection layer or interlayer for leveling of electrode unevenness ("planarisation layer"), frequently of a conducting, doped polymer
(4) Organic semiconductor
(5) Optionally insulation layer
(6) Second electrode, materials as mentioned under (2)
(7) Circuitry
(8) Encapsulation.

An advantage possessed by many of these organic devices, especially those based on polymeric semiconductors, is that they can be produced from solution, which is associated with less technical complexity and expenditure of resources than vacuum processes, as are generally carried out for low-molecular-weight compounds. For full-colour displays, the three basic colours (red, green, blue) have to be applied alongside one another at high resolution in individual pixels. An analogous situation applies to electronic circuits with different switching elements. Whereas, in the case of low-molecular-weight molecules that can be vapour-deposited, the individual pixels can be generated by the vapour deposition of the individual colours through shadow masks, this is not possible for polymeric materials and materials processed from solution. One solution here consists in applying the active layer (for example the light-emitting layer in OLEDs/PLEDs; an analogous situation applies to lasers or charge-transport layers in all applications) directly in a structured manner. Recently, various printing techniques, such as, for example, ink-jet printing (for example EP 0880303), offset printing, etc., in particular, have been considered for this purpose. Intensive work is currently being carried out, in particular, on the development of ink-jet printing methods, and considerable advances have recently been achieved here, so that the first commercial products produced in this way can be expected in the near future.

In devices for organic electronics, an interlayer of a conducting, doped polymer is frequently introduced between the electrode (in particular the anode) and the organic semiconductor and functions as charge-injection layer (*Appl. Phys. Lett.* 1997, 70, 2067-2069). The commonest of these polymers are polythiophene derivatives (for example poly(3,4-ethylenedioxy-2,5-thiophene), PEDOT) and polyaniline (PANI), which are generally doped with polystyrenesulfonic acid or other polymer-bound Bronsted acids and are thus brought into a conducting state. Without wishing to be tied to the correctness of this specific theory in the following invention, we assume that, on operation of the device, protons or other impurities diffuse out of the acidic groups into the functional layer, where they are suspected of significantly interfering with the functionality of the device. Thus, it is assumed that these impurities reduce the efficiency and also the service life of the devices.

More recent results (M. Leadbeater, N. Patel, B. Tierney, S. O'Connor, I. Grizzi, C. Towns, *Book of Abstracts,* SID Seattle, 2004) show that the introduction of a hole-conducting buffer layer between the charge-injection layer of a conducting doped polymer and the organic semiconductor results in significantly improved device properties, in particular in a significantly increased service life. In practice, the general procedure to date has been to apply this buffer layer by a surface-coating method and subsequently to anneal it. Ideally, a material is chosen for the buffer layer whose glass-transition temperature is below that of the conducting doped polymer, and the annealing is carried out at a temperature above the glass-transition temperature of the buffer layer, but below the glass-transition temperature of the conducting doped polymer in order to avoid damaging the latter by the annealing process. In general, this causes a thin part of the buffer layer to become insoluble, generally in the order of 1 to 25 nm. For a relatively low glass-transition temperature of the buffer layer, a material having a relatively low molecular weight is required. However, such a material cannot be applied by ink-jet printing since the molecular weight should be higher for good printing properties.

The soluble part of the buffer layer is then rinsed off by application of the organic semiconductor by spin coating, and the organic semiconductor layer is produced on the insoluble part of the buffer layer. Thus, a multilayered structure can be produced relatively easily here. However, application of the organic semiconductor to the buffer layer by a printing process is not possible in this way, since the solvent will then partially dissolve the soluble part of the buffer layer, and a blend of the material of the buffer layer and the organic semiconductor will be formed. The production of structured multilayered devices is thus not possible in this way.

The production of a device with buffer layer exclusively by ink-jet printing is thus hitherto still not possible, since on the one hand the buffer layer cannot be applied by printing techniques owing to the low molecular weight and since on the other hand the solution of the organic semiconductor partially dissolves the buffer layer on application by printing techniques. However, since printing techniques, in particular ink-jet printing, are regarded as a very important method for the production of structured devices, but on the other hand the use of buffer layers also has considerable potential for further developments, there is thus still a clear need for improvement here.

EP 0637899 proposes electroluminescent arrangements having one or more layers in which at least one layer is crosslinked and which, in addition, contain at least one emitter layer and at least one charge-transport unit per layer. The crosslinking here can proceed by means of free radicals, anionically, cationically or via a photoinduced ring-closure reaction. Thus, a plurality of layers can be built up one on top of the other, and the layers can also be structured induced by radiation. However, there is no teaching regarding which of the manifold crosslinking reactions can produce a suitable device and how the crosslinking reaction is best carried out. It is merely mentioned that free-radical-crosslinkable units or photocycloaddition-capable groups are preferred, that auxiliary substances of various types, such as, for example, initiators, may be present, and that the film is preferably crosslinked by means of actinic radiation. Neither are suitable device configurations described. It is thus not clear how many layers the device preferably has, how thick these should be, which classes of material are preferably involved and which thereof are to be crosslinked. It is therefore likewise incomprehensible to the person skilled in the art how the invention described can successfully be implemented in practice.

*ChemPhysChem* 2000, 207, describes a triarylamine layer based on low-molecular-weight compounds which is crosslinked via oxetane groups as interlayer between a conducting doped polymer and an organic luminescent semiconductor. Relatively high efficiency was obtained here. A device of this type cannot be produced by printing processes, in particular ink-jet printing, since the low-molecular-weight triarylamine derivatives do not produce sufficiently viscous solutions before crosslinking.

Surprisingly, it has now been found that the electronic properties of the devices can be significantly improved if at least one crosslinkable polymeric buffer layer, preferably a cationically crosslinkable polymeric buffer layer, is introduced between the conducting doped polymer and the organic semiconductor layer. Particularly good properties are obtained in the case of a buffer layer whose crosslinking is thermally induced, i.e. by increasing the temperature to 50-250° C. However, the crosslinking can also be initiated, for example, by irradiation with addition of a photoacid. In addition, a buffer layer of this type can advantageously also be applied by printing techniques, in particular ink-jet printing, since the ideal temperature for the thermal treatment here is independent of the glass-transition temperature of the material. This means that it is not necessary to rely on materials of low molecular weight, which in turn facilitates application of the layer by printing techniques. Since the buffer layer becomes insoluble due to the crosslinking, the subsequent layer (the organic semiconductor layer) can also be applied by various printing techniques, in particular ink-jet printing, since there is then no risk of partial dissolution of the buffer layer and blend formation.

The invention therefore relates to organic electronic devices comprising cathode, anode, at least one layer of a conducting, doped polymer and at least one layer of an organic semiconductor, characterised in that at least one conducting or semiconducting, preferably semiconducting, crosslinkable polymeric buffer layer, preferably a cationically crosslinkable buffer layer, is introduced between these two layers.

The semiconducting polymeric buffer layer is, for the crosslinking, preferably admixed with less than 3% by weight of a photoacid, particularly preferably less than 1% by weight, very particularly preferably with no photoacid.

Preference is furthermore given to a polymeric crosslinkable buffer layer whose crosslinking in the corresponding device arrangement can be induced thermally, i.e. by increasing the temperature without addition of further auxiliary substances, such as, for example, photoacids.

A photoacid is a compound which liberates a protic acid through a photochemical reaction on irradiation with actinic radiation. Examples of photoacids are 4-(thiophenoxyphenyl)diphenylsulfonium hexafluoroantimonate, {4-[(2-hydroxy-tetradecyl)oxyl]phenyl}phenyliodonium hexafluoroantimonate and others, as described, for example, in EP 1308781. The photoacid can be added for the crosslinking reaction, preferably with a proportion of about 0.5 to 3% by weight being selected, but does not necessarily have to be added.

For the purposes of this invention, electronic devices are organic or polymeric light-emitting diodes (OLEDs, PLEDs, for example EP 0 676 461, WO 98/27136), organic solar cells (O-SCs, for example WO 98/48433, WO 94/05045), organic field-effect transistors (O-FETs, for example U.S. Pat. No. 5,705,826, U.S. Pat. No. 5,596,208, WO 00/42668), organic thin-film transistors (O-TFTs), organic integrated circuits (O -ICs, for example WO 95/31833, WO 99/10939), organic field-quench elements (FQDs, for example US 2004/017148), organic optical amplifiers or organic laser diodes (O-lasers, for example WO 98/03566). For the purposes of this invention, organic means that at least one layer of an organic conducting doped polymer, at least one conducting or semiconducting polymeric buffer layer and at least one layer comprising at least one organic semiconductor are present; it is also possible for further organic layers (for example electrodes, etc.) to be present. However, it is also possible for layers which are not based on organic materials, such as, for example, further interlayers or electrodes, to be present.

In the simplest case, the electronic device is constructed from substrate (usually glass or plastic film), electrode, interlayer of a conducting, doped polymer, crosslinkable buffer layer according to the invention, organic semiconductor and counterelectrode. This device is correspondingly (depending on the application) structured, provided with contacts and finally hermetically sealed since the service life of devices of this type is drastically shortened in the presence of water and/or air. It may also be preferred here to use a conducting, doped polymer as electrode material for one or both electrodes and not to introduce an interlayer of conducting, doped polymer. For applications in O-FETs and O-TFTs, it is also necessary that, in addition to electrode and counterelectrode (source and drain), the structure also contains a further electrode (gate), which is separated from the organic semiconductor by an insulator layer having a generally high (or more rarely low) dielectric constant. In addition, it may be appropriate to introduce further layers into the device. The electrodes are selected so that their potential corresponds as well as possible to the potential of the adjacent organic layer in order to ensure the most efficient electron or hole injection possible. The cathode is preferably metals having a low work function, metal alloys or multilayered structures of various metals, such as, for example, alkaline-earth metals, alkali metals, main-group metals or lanthanoids (for example Ca, Ba, Mg, Al, In, Mg, Yb, Sm, etc.). In the case of multilayered structures, further metals which have a relatively high work function, such as, for example, Ag, may also be used in addition to the said metals, in which case combinations of the metals, such as, for example, Ca/Ag or Ba/Ag, are generally used.

It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides (for example LiF, $Li_2O$, $BaF_2$, MgO, NaF, etc.). The layer thickness of this dielectric layer is preferably between 1 and 10 nm.

The anode is preferably materials having a high work function. The anode preferably has a potential of greater than 4.5 eV vs. vacuum. Suitable for this purpose are on the one hand metals having a high redox potential, such as, for example, Ag, Pt or Au. Metal/metal oxide electrodes (for example Al/Ni/NiO$_x$, Al/Pt/PtO$_x$) may also be preferred.

For some applications, at least one of the electrodes must be transparent in order to facilitate either irradiation of the organic material (O-SC) or the coupling out of light (OLED/PLED, O-LASER). A preferred construction uses a transparent anode. Preferred anode materials here are conducting mixed metal oxides. Particular preference is given to indium-tin oxide (ITO) or indium-zinc oxide (IZO). Preference is furthermore given to conducting, doped organic materials, in particular conducting doped polymers.

Suitable as charge-injection layer on the anode are various doped, conducting polymers. Preference is given to polymers which have a conductivity of >$10^{-8}$ S/cm, depending on the application. The potential of the layer is preferably 4 to 6 eV vs. vacuum. The layer thickness is preferably between 10 and 500 nm, particularly preferably between 20 and 250 nm. Particular preference is given to the use of derivatives of polythiophene (in particular poly(3,4-ethylenedioxy-2,5-thiophene), PEDOT) and polyaniline (PANI). The doping is generally carried out by means of acids or oxidants. The doping is preferably carried out by means of polymer-bound Bronsted acids. For this purpose, particular preference is given to polymer-bound sulfonic acids, in particular poly (styrenesulfonic acid), poly(vinylsulfonic acid) and PAMPSA (poly-(2-acrylamido-2-methylpropanesulfonic acid)). The conducting polymer is generally applied from an aqueous solution or dispersion and is insoluble in organic solvents. This enables the subsequent layer to be applied without problems from organic solvents.

The organic semiconductor preferably comprises at least one polymeric compound. This can be a single polymeric compound or a blend of two or more polymeric compounds or a blend of one or more polymeric compounds with one or more low-molecular-weight organic compounds. The organic semiconductor layer can preferably be applied by various printing processes, in particular by ink-jet printing processes. For the purposes of this invention, an organic material is taken to mean not only purely organic compounds, but also organometallic compounds and metal coordination compounds with organic ligands. In the case of luminescent compounds, these can either fluoresce or phosphoresce, i.e. emit light from the singlet or triplet state. The polymeric materials here may be conjugated, partially conjugated or non-conjugated. Preference is given to conjugated materials. For the purposes of this invention, conjugated polymers are polymers which contain in the main chain principally sp$^2$-hybridised carbon atoms, which may also be replaced by corresponding hetero atoms. Furthermore, the term conjugated is likewise used in this application text if, for example, arylamine units and/or certain heterocycles (i.e. conjugation via N, O or S atoms) and/or organometallic complexes (i.e. conjugation via the metal atom) are present in the main chain. Typical representatives of conjugated polymers as can be used, for example, in PLEDs or O-SCs are poly-para-phenylenevinylenes (PPVs), polyfluorenes, polyspirobifluorenes, polydihydro-phenanthrenes, polyindenofluorenes, systems based in the broadest sense on poly-p-phenylenes (PPPs), and derivatives of these structures. Of particular interest for use in O-FETs are materials having high charge-carrier mobility. These are, for example, oligo- or poly(triarylamines), oligo- or poly(thiophenes) and copolymers containing a high proportion of these units. The layer thickness of the organic semiconductor is preferably 10-500 nm, particularly preferably 20-250 nm, depending on the application.

Without wishing to be tied to a certain theory, we assume that the protons or other cationic impurities present in the conducting doped polymer are problematic and diffusion thereof out of the doped polymer is suspected of being the limiting factor for the service life of the electronic device. In addition, hole injection from the doped polymers into the organic semiconductor is often unsatisfactory.

A polymeric buffer layer is therefore introduced between the conducting, doped polymer and the organic semiconductor which carries crosslinkable units, in particular cationically crosslinkable units, so that it can accommodate low-molecular-weight, cationic species and intrinsic cationic charge carriers which are able to diffuse out of the conducting, doped polymer. However, other crosslinkable groups, for example groups which are crosslinkable anionically or by means of free radicals, are also possible and in accordance with the invention. This layer furthermore serves for improved hole injection and as electron blocking layer. For the buffer layer, preference is given to the use of conjugated crosslinkable polymers. The molecular weight of the polymers used for the buffer layer before crosslinking is preferably in the range from 50 to 500 kg/mol, particularly preferably in the range from 200 to 250 g/mol. This molecular-weight range has proven particularly suitable for application by ink-jet printing. For other printing techniques, however, other molecular-weight ranges may also be preferred. The layer thickness of the buffer layer is preferably in the range from 1 to 300 nm, particularly preferably in the range from 15 to 200 nm, very particularly preferably in the range from 40 to 100 nm. The potential of the buffer layer is preferably between the potential of the conducting, doped polymer and that of the organic semiconductor in order to improve the charge injection. This can be achieved through a suitable choice of the materials for the buffer layer and suitable substitution of the materials.

It may also be preferred to admix further crosslinkable low-molecular-weight compounds with the polymeric material of the buffer layer. This may be appropriate in order, for example, to reduce the glass-transition temperature of the mixture and thus to facilitate crosslinking at a lower temperature.

Preferred materials for the buffer layer are derived from hole-conducting materials. Particularly preferably suitable for this purpose are cationically crosslinkable materials based on triarylamine, based on thiophene, based on triarylphosphine or combinations of these systems, where copolymers thereof with other structures, for example fluorenes, spirobifluorenes, dihydrophenanthrenes, indenofluorenes, etc., are also suitable materials if an adequately high proportion of the above-mentioned hole-conducting units is used. The proportion of hole-conducting units in the polymer is particularly preferably at least 10 mol %. The potentials of these compounds can be adjusted through suitable substitution. Thus, compounds having a lower HOMO (=highest occupied molecular orbital) are obtained through the introduction of electron-withdrawing substituents (for example F, Cl, CN, etc.), while a higher HOMO is achieved by electron-donating substituents (for example alkoxy groups, amino groups, etc.).

Without wishing to be tied to a certain theory, we assume that a cationically crosslinkable buffer layer is able to accommodate diffusing cationic species, in particular protons, through the crosslinking reaction being initiated thereby; on the other hand, the crosslinking simultaneously makes the buffer layer insoluble, so that subsequent application of the organic semiconductor from the usual organic solvents presents no problems. The crosslinked buffer layer represents a further barrier against diffusion. Preferred polymerisable groups are therefore cationically crosslinkable groups, in particular:

1) electron-rich olefin derivatives, 2) heteronuclear multiple bonds with hetero atoms or hetero groups and 3) rings containing hetero atoms (for example O, S, N, P, Si, etc.) which react by cationic ring-opening polymerisation.

Electron-rich olefin derivatives and compounds containing heteronuclear multiple bonds with hetero atoms or hetero groups are preferably those as described in H.-G. Elias, *Makromoleküle [Macromolecules], Volume 1. Fundamentals: Structure—Synthesis—Properties*, Hüthig & Wepf Verlag, Basle, 5th Edition, 1990, pp. 392-404, without wishing thereby to restrict the variety of possible compounds.

Preference is given to organic materials in which at least one H atom has been replaced by a group which reacts by cationic ring-opening polymerisation. A general review of cationic ring-opening polymerisation is given, for example, by E. J. Goethals et al., "Cationic Ring Opening Polymerisation" (*New Methods Polym. Synth.* 1992, 67-109). Generally suitable for this purpose are non-aromatic cyclic systems in which one or more ring atoms are, identically or differently, O, S, N, P, Si, etc. Preference is given here to cyclic systems having 3 to 7 ring atoms in which 1 to 3 ring atoms are, identically or differently, O, S or N. Examples of such systems are unsubstituted or substituted cyclic amines (for example aziridine, azeticine, tetrahydropyrrole, piperidine), cyclic ethers (for example oxirane, oxetane, tetrahydrofuran, pyran, dioxane), and also the corresponding sulfur derivatives, cyclic acetals (for example 1,3-dioxolane, 1,3-dioxepan, trioxane), lactones, cyclic carbonates, but also cyclic structures which contain different heteroatoms in the ring (for example oxazolines, dihydrooxazines, oxazolones). Preference is furthermore given to cyclic siloxanes having 4 to 8 ring atoms.

Very particular preference is given to polymeric organic materials in which at least one H atom has been replaced by a group of the formula (I), formula (II) or formula (III)

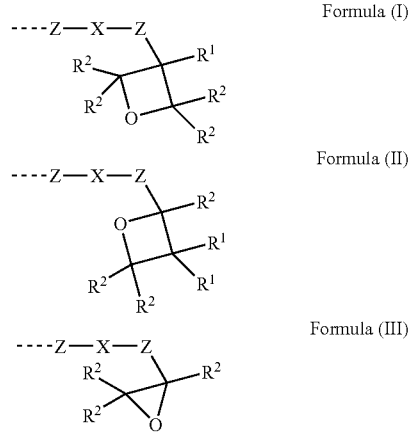

where:

$R^1$ is on each occurrence, identically or differently, hydrogen, a straight-chain, branched or cyclic alkyl, alkoxy or thioalkoxy group having 1 to 20 C atoms, an aromatic or heteroaromatic ring system having 4 to 24 aromatic ring atoms or an alkenyl group having 2 to 10 C atoms, in which one or more hydrogen atoms may be replaced by halogen, such as Cl and F, or CN, and one or more non-adjacent C atoms may be replaced by —O—, —S—, —CO—, —COO— or —O—CO—; a plurality of radicals $R^1$ here may also form a mono- or polycyclic, aliphatic or aromatic ring system with one another or with $R^2$, $R^3$ and/or $R^4$;

$R^2$ is on each occurrence, identically or differently, hydrogen, a straight-chain, branched or cyclic alkyl group having 1 to 20 C atoms, an aromatic or heteroaromatic ring system having 4 to 24 aromatic ring atoms or an alkenyl group having 2 to 10 C atoms, in which one or more hydrogen atoms may be replaced by halogen, such as Cl and F, or CN, and one or more non-adjacent C atoms may be replaced by —O—, —S—, —CO—, —COO— or —O—CO—; a plurality of radicals $R^2$ here may also form a mono- or polycyclic, aliphatic or aromatic ring system with one another or with $R^1$, $R^3$ and/or $R^4$;

X is on each occurrence, identically or differently, —O—, —S—, —CO—, —COO—, —O—CO— or a divalent group —$(CR^3R^4)_n$—;

Z is on each occurrence, identically or differently, a divalent group —$(CR^3R^4)_n$—;

$R^3$, $R^4$ is on each occurrence, identically or differently, hydrogen, a straight-chain, branched or cyclic alkyl, alkoxy, alkoxyalkyl or thioalkoxy group having 1 to 20 C atoms, an aromatic or heteroaromatic ring system having 4 to 24 aromatic ring atoms or an alkenyl group having 2 to 10 C atoms, in which one or more hydrogen atoms may also be replaced by halogen, such as Cl or F, or CN; two or more radicals $R^3$ or $R^4$ here may also form a ring system with one another or also with $R^1$ or $R^2$;

n is on each occurrence, identically or differently, an integer between 0 and 20, preferably between 1 and 10, in particular between 1 and 6;

with the proviso that the number of these groups of the formula (I) or formula (II) or formula (III) is limited by the maximum number of available, i.e. substitutable, H atoms.

The crosslinking of these units can be carried out, for example, by thermal treatment of the device at this stage. A photoacid for the crosslinking can optionally also be added. Preference is given to thermal crosslinking without addition of a photoacid. Further auxiliary substances may likewise optionally be added, such as, for example, salts or acids, which are added both to the buffer layer and also to the conducting polymer layer. This crosslinking is preferably carried out at a temperature of 80 to 200° C. and for a duration of 0.1 to 60 minutes in an inert atmosphere. This crosslinking is particularly preferably carried out at a temperature of 100 to 180° C. and for a duration of 1 to 30 minutes in an inert atmosphere.

The invention furthermore relates to the use of crosslinkable polymers for the production of a buffer layer according to the invention described above.

For the production of the devices, the following general process, which should be adapted correspondingly to the individual case without further inventive step, is generally used:

A substrate (for example glass or also a plastic) is coated with the anode (for example indium-tin oxide, ITO, etc.). The anode is subsequently structured (for example photolithographically) and connected in accordance with the desired application. The anode-coated, pre-cleaned substrate is treated with ozone or with oxygen plasma or irradiated briefly with an excimer lamp.

A conducting polymer, for example a doped polythiophene (PEDOT) or polyaniline derivative (PANI), is subsequently applied in a thin layer to the ITO substrate by spin coating or other coating methods.

The crosslinkable buffer layer according to the invention is applied to this layer. To this end, the corresponding compound is firstly dissolved in a solvent or solvent mixture, preferably under a protective gas, and filtered. Suitable solvents are aromatic liquids (for example toluene, xylenes, anisole, chlorobenzene), cyclic ethers (for example dioxane, methyidioxane, THF) or amides (for example NMP, DMF), but also solvent mixtures as described in WO 02/072714. The supports described above can be coated over the entire surface with these solutions, for example by spin-coating methods, or in a structured manner by printing processes, in particular ink-jet printing. The crosslinking can then be carried out (in the case of the use of cationically crosslinkable groups) by heating the device in an inert atmosphere at this stage. A photoacid can also be added and the crosslinking initiated by irradiation, also enabling structuring to be achieved. Depending on the type of crosslinkable group, the crosslinking can be initiated in various ways. Rinsing with a solvent, for example THF, can optionally subsequently be carried out. Finally, drying is carried out.

A solution of an organic semiconductor is applied thereto. Suitable for the production of structured devices here are, in particular, printing processes, for example ink-jet printing. The crosslinking of the buffer layer makes application of the organic semiconductor from solution possible without problems without the buffer layer being dissolved in the process.

Further functional layers, such as, for example, charge-injection or -transport layers or hole-blocking layers, can optionally be applied to these polymer layers, for example from solution, but also by vapour deposition.

A cathode is subsequently applied. This is carried out in accordance with the prior art by a vacuum process and can take place, for example, either by thermal vapour deposition or by plasma spraying (sputtering).

Since many of the applications react sensitively to water, oxygen or other constituents of the atmosphere, effective encapsulation of the device is vital.

The structure described above is adapted and optimised correspondingly for the individual applications without further inventive step and can be used in general for various applications, such as organic and polymeric light-emitting diodes, organic solar cells, organic field-effect transistors, organic thin-film transistors, organic integrated circuits, organic optical amplifiers or organic laser diodes.

Surprisingly, this crosslinkable buffer layer that is introduced between the conducting, doped polymer and the organic semiconductor offers the following advantages:

1) Introduction of the crosslinkable buffer layer according to the invention improves the opto-electronic properties of the electronic device compared with a device comprising no buffer layer of this type. Thus, higher efficiency and a longer service life are observed.

2) Crosslinking of the buffer layer enables thicker buffer layers to be produced than is possible with uncrosslinked buffer layers, which only form a thin insoluble layer by annealing and rinsing. With these thicker, crosslinked buffer layers, better device results are obtained than with uncrosslinked, thinner buffer layers in accordance with the prior art.

3) Cationic crosslinking of the buffer layer overcomes the reliance on a low glass-transition temperature and thus on a low-molecular-weight material for the annealing. The fact that high-molecular-weight materials can now also be used for this purpose enables the buffer layer to be applied by ink-jet printing.

4) Crosslinking of the buffer layer gives an insoluble layer. This enables the subsequent layer of the organic semiconductor to be applied by a printing process, for example ink-jet printing, without the buffer layer being dissolved and a blend of the material of the buffer layer and the organic semiconductor forming. This is not possible with buffer layers in accordance with the prior art and is of major importance for the production of structured devices.

The present invention is explained in greater detail by the following examples, without wishing to be restricted thereto. In these examples, only organic and polymeric light-emitting diodes are discussed. However, the person skilled in the art will be able to produce further electronic devices, such as, for example, O-SCs, O-FETs, O-TFTs, O-ICs, organic optical amplifiers and O-lasers, to mention but a few further applications, from the examples listed without inventive step.

EXAMPLES

Example 1

Layer Thickness of the Crosslinkable Buffer Layer

A layer of crosslinkable buffer layer A (polymer having structure A) with a thickness of 60 nm was applied by spin coating to a device having the following layer structure: glass//150 nm ITO//H80 nm PEDOT (annealed at 200° C. for 10 min.). The device was subsequently heated at 180° C. for 1 h. PEDOT is a polythiophene derivative (Baytron P4083 from H. C. Starck, Goslar). The device was washed with toluene by spinning, and the resultant layer thickness was measured. A layer thickness of 60 nm (±2 nm) was determined for the buffer layer.

Example 2 (Comparison)

Layer Thickness of the Uncrosslinkable Buffer Layer

A layer of uncrosslinkable buffer layer B (polymer having structure B) with a thickness of 60 nm was applied by spin coating to a device having the following layer structure: glass//150 nm ITO//80 nm PEDOT (annealed at 200° C. for 10 min.). The device was subsequently heated at 180° C. for 1 h. The device was washed with toluene by spinning, and the resultant layer thickness was measured. A layer thickness of 10 nm (±1 nm) was determined for the buffer layer.

Example 3

OLED Having a Crosslinkable Buffer Layer 80 nm of the blue-emitting polymer C were applied by spin-coating to the device having a 60 nm buffer layer A. The total layer thickness measured (PEDOT+buffer layer+emitting polymer) was 220 nm (±4 nm). The cathode used was in all cases Ba from Aldrich and Ag from Aldrich. The way in which PLEDs can be produced in general is described in detail, for example, in WO 04/037887 and the literature cited therein.

A maximum efficiency of 4.1 cd/A and a service life of 640 h (beginning from 800 cd/m$^2$) were measured for the device.

Example 4 (Comparison)

OLED Having an Uncrosslinkable Buffer Layer 80 nm of the blue-emitting polymer C were applied by spin coating to the device having a 60 nm buffer layer B (not rinsed with toluene). The total layer thickness measured (PEDOT+ buffer layer+emitting polymer) was 170 nm (±3 nm).

A maximum efficiency of 3.5 cd/A and a service life of 420 h (beginning from 800 cd/m²) were measured for the device.

Example 5 (Comparison)

OLED Without a Buffer Layer 80 nm of the blue-emitting polymer C were applied by spin coating to a device consisting of glass/150 nm ITO//80 nm PEDOT (annealed at 200° C. for 10 min.). The total layer thickness measured (PEDOT+buffer layer+emitting polymer) was 160 nm (±3 nm).

A maximum efficiency of 3.1 cd/A and a service life of 180 h (beginning from 800 cd/m²) were measured for the device.

Polymers A, B and C and the corresponding monomers were synthesised as described in WO 02/10129, WO 03/020790 and WO 03/048225. The compositions and structures of polymers A, B and C are shown below for reasons of clarity:

Polymer A:

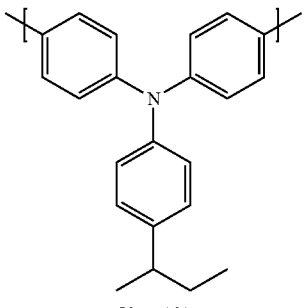

50 mol %

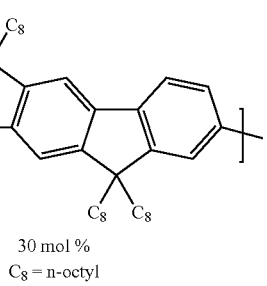

30 mol %
C₈ = n-octyl

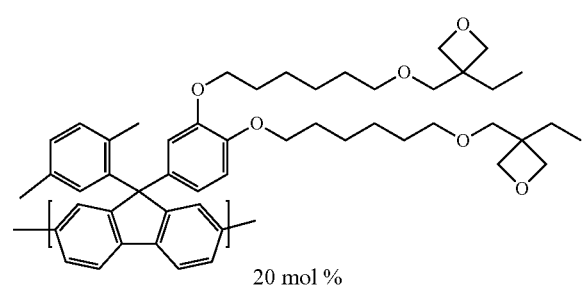

20 mol %

Polymer B:

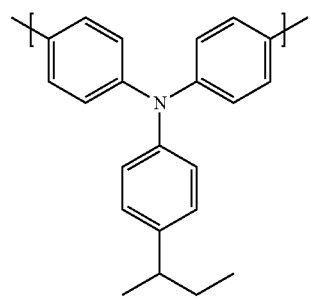

50 mol %

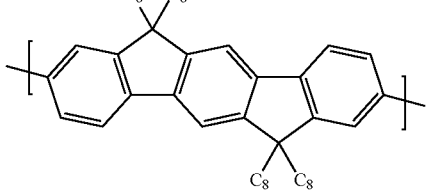

50 mol %
C₈ = n-octyl

Polymer C:

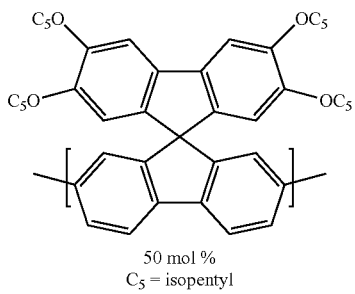

50 mol %
C₅ = isopentyl

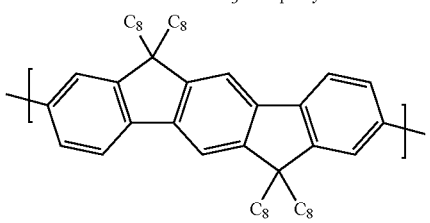

49 mol %
C₈ = n-octyl

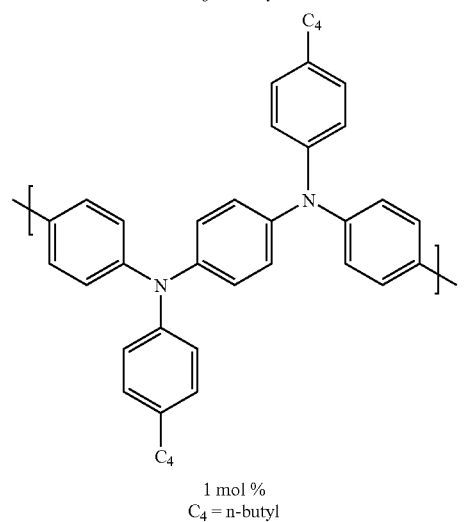

1 mol %
C₄ = n-butyl

As is thus evident from Example 1 and Comparative Example 2, the crosslinkable buffer layer enables the production of thicker, insoluble layers, to which the light-emitting polymer can then be applied. In particular, it is also possible to apply polymer C to crosslinked polymer A by printing techniques since the latter is no longer dissolved by solvents, while it is not possible to apply polymer C to uncrosslinked polymer B since the latter is dissolved thereby.

It is likewise evident from Example 3 and Comparative Example 4 that polymer C exhibits higher efficiency and a longer service life if it is used with a buffer layer, in contrast to Comparative Example 5, in which it was applied directly to PEDOT without a buffer layer. It is striking here that the use of a crosslinkable buffer layer leads to significantly better results (higher efficiency, longer service life) than the use of the uncrosslinkable buffer layer.

The invention claimed is:

1. An organic electronic device comprising cathode, anode, at least one layer of a conducting, doped polymer and at least one layer of an organic semiconductor, wherein at least one conducting or semiconducting crosslinked polymeric buffer layer is introduced between the doped polymer and the organic semiconductor and wherein the organic semiconductor comprises at least one luminescent polymeric compound wherein the crosslinked polymeric buffer layer has a molecular weight in the range from 50 to 500 kg/mol before crosslinking.

2. The organic electronic device according to claim 1, wherein the device is an organic or polymeric light-emitting diode (OLED, PLED), organic solar cell (O-SC), organic field-effect transistor (O-FET), organic thin-film transistor (O-TFT), organic integrated circuit (O-IC), organic field-quench element (FQD), organic optical amplifier or organic laser diode (O-laser).

3. The organic electronic device according to claim 1, wherein the conducting doped polymer used is a derivative of polythiophene or polyaniline, and the doping is carried out by means of polymer-bound acids or by means of oxidants.

4. The organic electronic device according to claim 1, wherein the polymeric compound is a conjugated polymer.

5. The organic electronic device according to claim 4, wherein the organic semiconductor employed is a conjugated polymer from the classes of the poly-para-phenylenevinylenes (PPVs), polyfluorenes, polyspirobifluorenes, polydihydrophenanthrenes, polyindenofluorenes, systems based in the broadest sense on poly-p-phenylenes (PPPs), and derivatives of these structures.

6. The organic electronic device according to claim 1, wherein the organic semiconductor is applied by a printing process.

7. The organic electronic device according to claim 1, wherein the crosslinked polymeric buffer layer is applied by a printing process.

8. The organic electronic device according to claim 1, wherein the layer thickness of the crosslinked polymeric buffer layer is in the range from 1 to 300 nm.

9. The organic electronic device according to claim 1, wherein the buffer layer is built up from a conjugated polymer.

10. The organic electronic device according to claim 1, wherein the materials of the buffer layer are triarylamine, thiophene or triarylphosphine polymers or combinations of these systems.

11. The organic electronic device according to claim 1, wherein the materials of the buffer layer are copolymers of triarylamine, thiophene and/or triarylphosphine derivatives with fluorenes, spirobifluorenes, dihydrophenanthrenes and/or indenofluorenes.

12. The organic electronic device according to claim 1, wherein the buffer layer is cationically crosslinked.

13. The organic electronic device according to claim 12, wherein the crosslinked polymer buffer layer is crosslinked by crosslinkable groups which are selected from electron-rich olefin derivatives, heteronuclear multiple bonds with hetero atoms or hetero groups or rings containing hetero atoms which react by cationic ring-opening polymerisation.

14. The organic electronic device according to claim 13, characterised in that at least one H atom in the materials of the buffer layer has been replaced by a heterocyclic compound which reacts by cationic ring-opening polymerisation.

15. The organic electronic device according to claim 14, wherein at least one H atom in the materials of the buffer layer has been replaced by a group of the formula (I), formula (II) or formula (III)

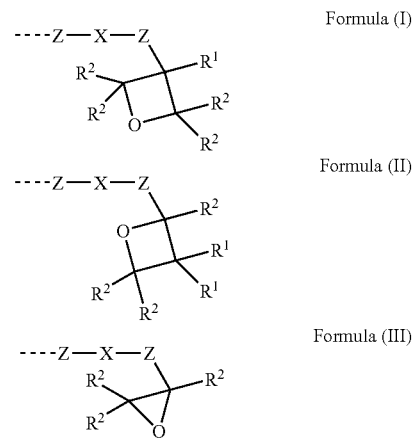

where:
$R^1$ is on each occurrence, identically or differently, hydrogen, a straight-chain, branched or cyclic alkyl, alkoxy or thioalkoxy group having 1 to 20 C atoms, an aromatic or heteroaromatic ring system having 4 to 24 aromatic ring atoms or an alkenyl group having 2 to 10 C atoms, in which one or more hydrogen atoms may be replaced by halogen, or CN, and one or more non-adjacent C atoms may be replaced by —O—, —S—, —CO—, —COO— or —O—CO—; a plurality of radicals $R^1$ here may also form a mono- or polycyclic, aliphatic or aromatic ring system with one another or with $R^2$, $R^3$ and/or $R^4$;

$R^2$ is on each occurrence, identically or differently, hydrogen, a straight-chain, branched or cyclic alkyl group having 1 to 20 C atoms, an aromatic or heteroaromatic ring system having 4 to 24 aromatic ring atoms or an alkenyl group having 2 to 10 C atoms, in which one or more hydrogen atoms may be replaced by halogen, or CN, and one or more non-adjacent C atoms may be replaced by —O—, —S—, —CO—, —COO— or —O—CO—; a plurality of radicals $R^2$ here may also form a mono- or polycyclic, aliphatic or aromatic ring system with one another or with $R^1$, $R^3$ and/or $R^4$;

X is on each occurrence, identically or differently, —O—, —S—, —CO—, —COO—, —O—CO— or a divalent group —$(CR^3R^4)_n$—;

Z is on each occurrence, identically or differently, a divalent group —$(CR^3R^4)_n$—;

$R^3$, $R^4$ is on each occurrence, identically or differently, hydrogen, a straight-chain, branched or cyclic alkyl, alkoxy, alkoxyalkyl or thioalkoxy group having 1 to 20 C atoms, an aromatic or heteroaromatic ring system having 4 to 24 aromatic ring atoms or an alkenyl group having 2 to 10 C atoms, in which one or more hydrogen atoms may also be replaced by halogen, or CN; two or more radicals $R^3$ or $R^4$ here may also form a ring system with one another or also with $R^1$ or $R^2$, n is on each occurrence, identically or differently, an integer between 0 and 20, with the proviso that the number of these groups of the formula (I) or formula (II) or formula (III) is limited by the maximum number of available, i.e. substitutable, H atoms.

16. The organic electronic device according to claim 1, wherein the crosslinking of the buffer layer is initiated by addition of a photoacid.

17. The organic electronic device according to claim 1, wherein the crosslinking of the buffer layer is carried out by thermal treatment without addition of a photoacid.

18. The organic electronic device according to claim 17, wherein the crosslinking is carried out at a temperature of 80 to 200° C. and for a duration of 0.1 to 60 minutes in an inert atmosphere.

19. The organic electronic device according to claim 13, wherein $R^1$ is on each occurrence, identically or differently, hydrogen, a straight-chain, branched or cyclic alkyl, alkoxy or thioalkoxy group having 1 to 20 C atoms, an aromatic or heteroaromatic ring system having 4 to 24 aromatic ring atoms or an alkenyl group having 2 to 10 C atoms, in which one or more hydrogen atoms may be replaced by Cl, F, or CN, and one or more non-adjacent C atoms may be replaced by —O—, —S—, —CO—, —COO— or —O—CN—; a plurality of radicals $R^1$ here may also form a mono- or polycyclic, aliphatic or aromatic ring system with one another or with $R^2$, $R^3$ and/or $R^4$;

$R^2$ is on each occurrence, identically or differently, hydrogen, a straight-chain, branched or cyclic alkyl group having 1 to 20 C atoms, an aromatic or heteroaromatic ring system having 4 to 24 aromatic ring atoms or an alkenyl group having 2 to 10 C atoms, in which one or more hydrogen atoms may be replaced by Cl, F, or CN, and one or more non-adjacent C atoms may be replaced by —O—, —S—, —CO—, —COO— or —O—CO—; a plurality of radicals $R^2$ here may also form a mono- or polycyclic, aliphatic or aromatic ring system with one another or with $R^1$, $R^3$ and/or $R^4$;

$R^3$, $R^4$ is on each occurrence, identically or differently, hydrogen, a straight-chain, branched or cyclic alkyl, alkoxy, alkoxyalkyl or thioalkoxy group having 1 to 20 C atoms, an aromatic or heteroaromatic ring system having 4 to 24 aromatic ring atoms or an alkenyl group having 2 to 10 C atoms, in which one or more hydrogen atoms may also be replaced by Cl, F, or CN; two or more radicals $R^3$ or $R^4$ here may also form a ring system with one another or also with $R^1$ or $R^2$, n is on each occurrence, identically or differently, an integer between 1 and 6.

\* \* \* \* \*